United States Patent [19]

Takeda et al.

[11] Patent Number: 5,352,564

[45] Date of Patent: Oct. 4, 1994

[54] RESIST COMPOSITIONS

[75] Inventors: Yoshihumi Takeda; Toshinobu Ishihara; Ken'ichi Itoh; Kazumasa Maruyama, all of Niigata, Japan

[73] Assignee: Shin-Etsu Chemical Co., Ltd., Tokyo, Japan

[21] Appl. No.: 184,171

[22] Filed: Jan. 19, 1994

[30] Foreign Application Priority Data

Jan. 19, 1993 [JP] Japan ................. 5-023770
Jan. 19, 1993 [JP] Japan ................. 5-023771
Apr. 19, 1993 [JP] Japan ................. 5-115306
Apr. 19, 1993 [JP] Japan ................. 5-115307
Apr. 19, 1993 [JP] Japan ................. 5-115308

[51] Int. Cl.⁵ ............................................. G03C 1/492
[52] U.S. Cl. ................................. 430/270; 522/150; 522/160
[58] Field of Search .................. 430/270, 325, 326; 522/150, 160

[56] References Cited

U.S. PATENT DOCUMENTS 4,603,101  7/1986  Cridello .................. 522/150
5,128,231  7/1992  Itoh et al. ................ 522/150

*Primary Examiner*—Jack P. Brammer
*Attorney, Agent, or Firm*—Millen, White, Zelano, & Branigan

[57] ABSTRACT

A resist composition comprising a base resin, an acid release agent, and a dissolution inhibitor is improved in sensitivity and resolution when the base resin is typically selected from poly-t-butoxystyrene/polyhydroxystyrene, poly-t-butoxystyrene/poly-p-methoxymethoxystyrene/polyhydroxystyrene, and poly-t-butoxystyrene/poly-p-methoxystyrene/polyhydroxystyrene copolymers. The composition forms a resist useful for the manufacture of LSI.

12 Claims, No Drawings

RESIST COMPOSITIONS

BACKGROUND OF THE INVENTION

1. Field of the Invention

This invention relates to a resist composition of the chemical amplification type for use in forming fine patterns upon manufacture of super LSIs.

2. Prior Art

With the advance of LSI technology, the memory capacity of IC chips reaches an order of mega bits and a rule of submicron is thus required for the fineness of wiring pattern. Accordingly, lithography light sources are shifting toward shorter wavelength from the ultraviolet band to the deep ultraviolet band which is more advantageous for fine patterning. Also, the current mainstream of etching step involved in the LSI manufacturing process is dry etching using RF plasma.

In these circumstances, the lithography technology uses resists which have to be sensitive and transmissive to the wavelength used and resistant against dry etching. More particularly, novolak type resins and other aromatic resins are useful resists for use in photolithography, especially g and i-ray lithography in view of light transmittance at the wavelength used and plasma etching resistance.

However, the light source intensity of deep ultraviolet light including mercury line spectrum on a shorter wavelength side than g and i-rays and excimer laser light such as KrF and ArF is extremely weaker than the light source intensity of g and i-rays. Utilization of such deep-UV light in photolithography has the problem that prior art resists conventionally used with g and i-rays provide unacceptable exposure sensitivity and low light transmittance to deep-UV light. There is a need for a new type of resist.

Resists of the chemical amplification type were developed as a substitute for the conventional resists. For example, Japanese Patent Application Kokai (JP-A) No. 45439/1984 discloses a resist composition comprising p-tert-butoxycarbonyloxy-α-methylstyrene which is one of polymers having acid unstable, recurring branched groups and a diaryl iodonium salt which is one of photo-polymerization initiators capable of generating acid upon exposure to radiation. Upon exposure of the resist to deep-UV light, the diaryl iodonium salt decomposes to generate an acid which in turn, causes cleavage of the p-tert-butoxy-carbonyl group of p-tert-butoxycarbonyloxy-α-methylstyrene into a polar group. Then a desired pattern is obtained by dissolving away the thus exposed areas or unexposed areas with base or non-polar solvent.

JP-A 115440/1987 discloses a resist composition comprising poly-4-tert-butoxy-α-methylstyrene and di(tert-butylphenyl) iodonium trifluoromethane sulfonate which are dissolved in diglyme and then exposed to deep-UV light. This resist achieves a high degree of resolution through the same reaction mechanism as the resist of JP-A 45439/1984.

Like the resist composition comprising poly-4-tert-butoxystyrene and an acid release agent disclosed in JP-A 115440/1987, JP-A 223858/1991 discloses a two-component system resist composition comprising a resin having a tert-butoxy group in its molecule and an acid release agent and JP-A 211258/1992 discloses a two-component system resist composition comprising a polyhydroxystyrene containing a methyl, isopropyl, tert butyl, tetrahydro-pyranyl or trimethylsilyl group in its molecule and an acid release agent.

The polymers used in these well-known resists as a major component are obtained by conventional radical or cationic polymerization of corresponding monomers. Since no special attention was paid to the molecular weight distribution of polymers, there were obtained polymers having a broad and uneven molecular weight distribution. Another base polymer of the chemical amplification type used in conventional resist compositions is a hydroxy-styrene resin in which some hydroxyl groups are replaced by tert-butoxycarbonyloxy groups (abbreviated as t-Boc groups). This resin is thermally unstable and the t-Boc groups are readily split off.

In these two-component system positive resist compositions comprising a hydroxystyrene resin in which hydroxyl groups are protected with protective groups and an acid release agent, many protective groups must be decomposed in exposed areas before the resist film can be dissolved in a developer. This undesirably leaves the increased possibility of changing film thickness and introducing stresses and bubbles in the film.

A number of chemical amplification type positive resist compositions have been proposed as mentioned above although they have some problems and are difficult to use in practice.

SUMMARY OF THE INVENTION

Making investigations on a chemical amplification type resist composition having high sensitivity, high resolution, process adaptability, and commercial applicability, the inventors have found that when an acid release agent, typically an onium salt and a dissolution inhibitor containing an acid unstable group are blended with a resin of the rational formula (1), (2) or (3) shown below as a base resin, there is obtained a resist composition which minimizes the possibility of changing film thickness and generating bubbles because the amount of dissolution inhibitor which is to be decomposed with the acid is reduced and which is advantageous in precise fine patterning and useful as a resist material for the manufacture of super LSIs.

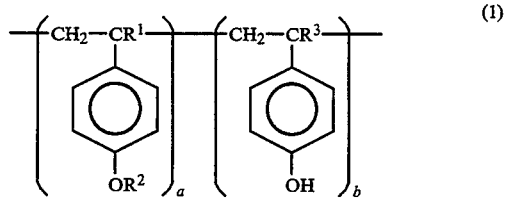
(1)

Each of $R^1$ and $R^3$ is a hydrogen atom or methyl group and $R^2$ is a tert-butyl group. Letters a and b satisfy $a+b=1$.

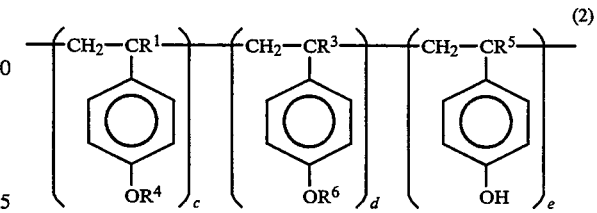
(2)

Each of $R^1$, $R^3$ and $R^5$ is a hydrogen atom or methyl group, $R^4$ is a tert-butyl group, and $R^6$ is an acid hydrolyzable group selected from the group consisting of methoxymethyl, tetrahydro-pyranyl, trialkylsilyl, isopropoxymethyl, tetrahydrofuranyl, and tert-butoxycarbonyl, groups. Letters c, d and e satisfy c+d+e=1.

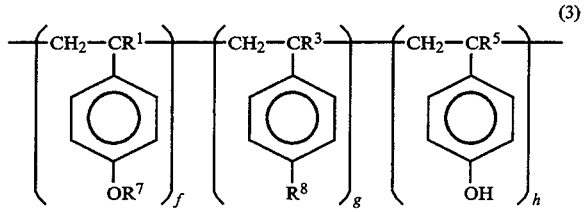

(3)

Each of $R^1$, $R^3$ and $R^5$ is a hydrogen atom or methyl group, $R^7$ is selected from the group consisting of tert-butyl, methoxymethyl, tetrahydropyranyl, and trialkylsilyl groups, and $R^8$ is a lower alkoxy group such as a methoxy and ethoxy group or a hydrogen atom. Letters f, g and h satisfy f+g+h=1.

When the base resin of formula (1), (2) or (3) is a narrow disperse polymer having a molecular weight dispersity Mw/Mn of 1.0 to 1.4, the resolution is substantially increased in that good resolution is achieved to a level of 0.4 μm or less upon exposure to excimer laser light.

Note that the dispersity used herein is a molecular weight distribution defined as the weight average molecular weight divided by the number average molecular weight, i.e., Mw/Mn.

The base resin of formula (1) is known as a major component of resist materials. The polymers used in well-known resists as a major component are obtained by conventional radical or cationic polymerization of corresponding monomers. Since no special attention was paid to the molecular weight distribution of polymers or no means was taken for controlling the distribution, there were obtained polymers having a broad and uneven molecular weight distribution. We have found that these polymers having a broad dispersity do not well accommodate excimer laser light. In order to enhance resolution enough to provide a ultra-fine pattern by exposure to excimer laser light, the base resin of formula (1) should advantageously have a dispersity Mw/Mn of 1.0 to 1.4, preferably 1.0 to 1.3.

By using a polymer having such a narrow dispersity, there is obtained a heat resistant resin. By using a resin of such design as a major component, there is obtained a resist composition which has sufficient sensitivity upon exposure to UV and deep-UV light and which eliminates a lowering of light intensity, a lowering of vacuum during a vacuum step in the wafer manufacturing process, contamination of the processing atmosphere, and retardation of polymer dissolving rate, and thus eliminates unstable factors involved in patterning. The composition is thus useful as a resist material for the manufacture of super LSIs.

According to the present invention, there is provided a chemical amplification type resist composition comprising (A) a base resin represented by the rational formulae (1), (2) or (3), (B) an acid release agent capable of generating an acid upon exposure to light, and (C) a dissolution inhibitor containing an acid unstable group.

DETAILED DESCRIPTION OF THE INVENTION

In a first form of the chemical amplification type resist composition of the present invention, the base resin used in the composition as the major component (A) is a polymer of the following rational formula (1):

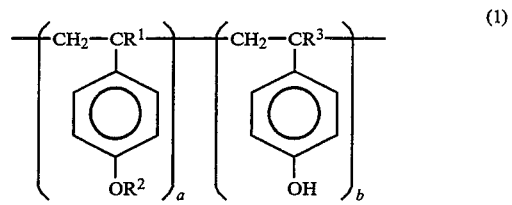

(1)

wherein each of $R^1$ and $R^3$ is a hydrogen atom or methyl group, $R^2$ is a tert-butyl group, and letters a and b satisfy a +b =1.

In order to achieve high resolution, the polymer of formula (1) should preferably have a dispersity Mw/Mn of 1.0 to 1.4, more preferably 1.0 to 1.3. A dispersity of more than 1.4 tends to incur a substantial lowering of resolution.

In formula (1) wherein a+b=1, it is recommended from the standpoints of film retention, resolution and pattern configuration that a is in the range of 0.05 to 0.5, preferably 0.1 to 0.3, more preferably 0.12 to 0.25.

The polymer can be prepared, for example, by polymerizing p-tert-butoxystyrene or p-tert-butoxy-α-methylstyrene monomer into poly-p-tert-butoxystyrene or poly-p-tert-butoxy-α-methylstyrene and splitting off some of ether bonds in the polymer. This polymerization may be effected by any desired method including radical, cationic and anionic polymerization methods.

The resulting polymer is optionally worked up and isolated by adding methanol to the reaction mixture to cause precipitation, followed by washing and drying. In general, a polymer as reacted contains impurities such as unreacted reactants and by-products and if a composition containing this polymer is used as a resist in the manufacture of super LSI, the impurities can adversely affect the wafer manufacturing process. Therefore, full purification of the polymer is recommended. Additionally, since resist properties largely depend on the molecular weight dispersity of the polymer, it is preferred to control the molecular weight distribution by any desired method, for example, by removing a low molecular weight moiety by fractionation, so that the dispersity may fall in the range of 1.0 to 1.4.

Next, ether bonds in the polymer are partially split off with an acid, obtaining a polymer represented by rational formula (1). This scission reaction of ether bonds is readily carried out by dissolving the polymer in a solvent such as dioxane, acetone, acetonitrile and benzene or a mixture thereof, and adding dropwise an acid such as hydrochloric acid, hydrobromic acid, para-toluenesulfonate pyridinium salt and trifluoroacetic acid. The degree of splitting off varies with the amount of acid added. In the case of hydrochloric acid, for example, the degree of splitting off is controlled by suitably selecting the amount of hydrochloric acid in the range of 0.1 to 2 times the moles of ether bonds. Preferably the value of a representative of the residual proportion of ether bonds is controlled to fall in the range of 0.05 to 0.5, more preferably 0.1 to 0.3, most preferably 0.12 to 0.25.

In a second form of the resist composition of the present invention, the base resin used as the major component (A) is a polymer of the following rational formula (2):

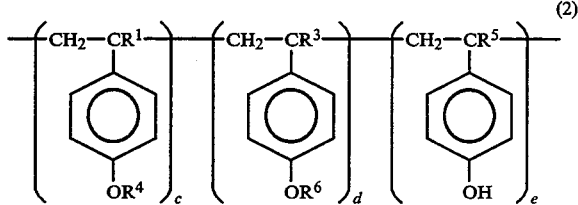

(2)

wherein each of $R^1$, $R^3$ and $R^5$ is a hydrogen atom or methyl group, $R^4$ is a tert-butyl group, $R^6$ is an acid hydrolyzable group selected from the group consisting of methoxymethyl, tetrahydro-pyranyl, trialkylsilyl, isopropoxymethyl, tetrahydrofuranyl, and tert-butoxycarbonyl groups, and letters c, d and e satisfy $c+d+e=1$.

The polymer of formula (2) can be prepared, for example, by effecting block or random copolymerization between a p-tert-butoxystyrene or p-tert-butoxy-α-methylstyrene and one or more monomers of p-methoxymethoxystyrene, p-tetrahydropyranyloxystyrene and p-trimethylsiloxystyrene to form a copolymer of the rational formula (4) shown below, and treating the copolymer with an acid to partially and selectively split off only tert-butoxy groups.

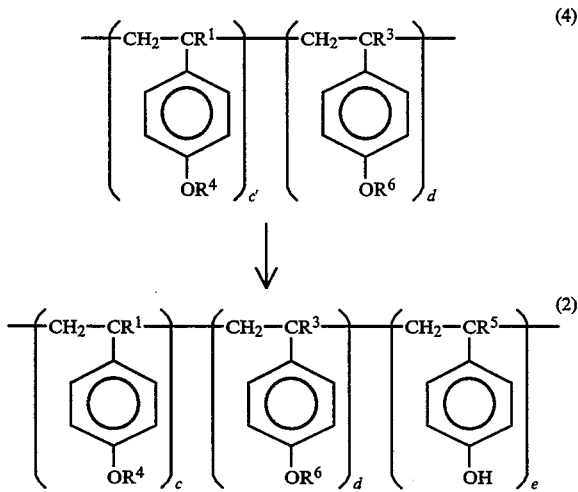

It is understood that $c'+d=1$ in formula (4) and $c+d+e=1$ in formula (2).

The polymerization to form a copolymer of formula (4) may be effected by any desired method including radical, cationic and anionic polymerization methods.

The resulting copolymer of formula (4) is optionally worked up and isolated by adding methanol to the reaction mixture to cause precipitation, followed by washing and drying. As previously mentioned, if a composition based on a polymer containing impurities is used as a resist in the manufacture of super LSI, the impurities can adversely affect the wafer manufacturing process. Therefore, full purification of the polymer is recommended. Additionally, since resist properties largely depend on the molecular weight dispersity of the polymer, it is preferred to control the molecular weight distribution by any desired method, for example, by removing a low molecular weight moiety from the copolymer of formula (4) by fractionation, so that the dispersity may fall in the range of 1.0 to 1.4, preferably 1.0 to 1.3.

Next, only ether bonds of $R^4$ in the copolymer of formula (4) are partially and selectively split off with an acid, obtaining a copolymer represented by rational formula (2). Scission of tert-butoxy groups is readily carried out by dissolving the polymer in a solvent such as dioxane, acetone, acetonitrile and benzene or a mixture thereof, and adding dropwise an acid such as hydrochloric acid, hydrobromic acid, para-toluenesulfonate pyridinium salt and trifluoroacetic acid. The degree of splitting off varies with the amount of acid added. In the case of hydrochloric acid, for example, the degree of splitting off is controlled by suitably selecting the amount of hydrochloric acid in the range of 0.1 to 2 times the moles of ether bonds. It is recommended from the standpoints of film retention, resolution and pattern configuration that the value of c representative of the residual proportion of tert-butoxy groups ($R^4$) is controlled to fall in the range of 0.05 to 0.45, more preferably 0.1 to 0.25. It is also preferred that d is in the range of 0.05 to 0.25, especially 0.05 to 0.2 and e is in the range of 0.5 to 0.9, especially 0.7 to 0.85.

In a third form of the resist composition of the present invention, the base resin used as the major component (A) is a polymer of the following rational formula (3):

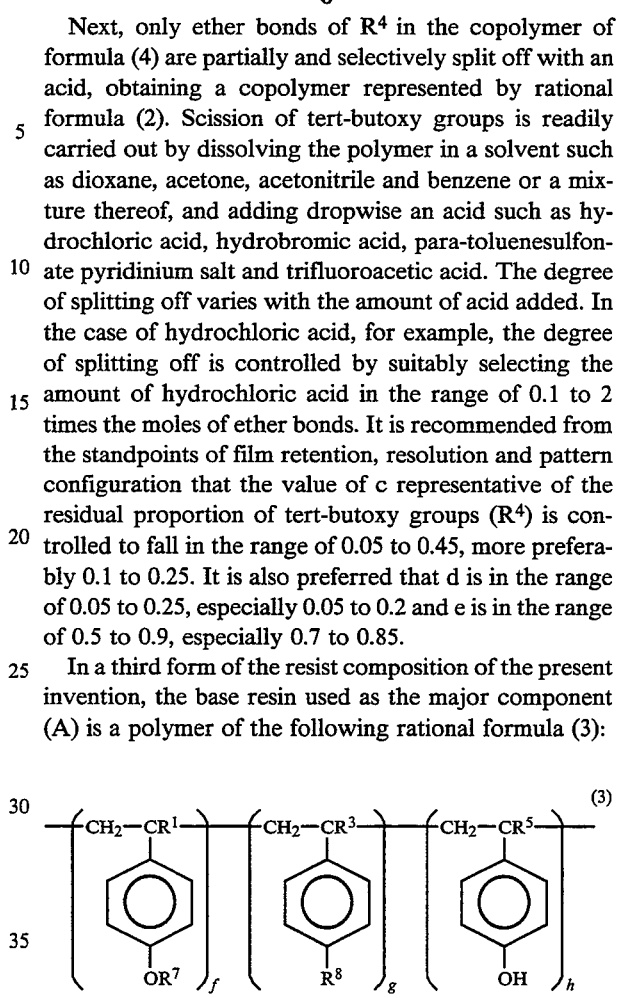

wherein each of $R^1$, $R^3$ and $R^5$ is a hydrogen atom or methyl group, $R^7$ is a tert-butyl, methoxymethyl, tetrahydropyranyl, or trialkylsilyl group, $R^8$ is a lower alkoxy group such as a methoxy and ethoxy group or a hydrogen atom, and letters f, g and h satisfy $f+g+h=1$.

The polymer of formula (3) can be prepared, for example, by copolymerizing a mixture of a first monomer such as p-methoxystyrene, p-methoxy-α-methylstyrene, p-ethoxystyrene, and p-ethoxy-α-methylstyrene and a second monomer such as p-tert-butoxystyrene, p-tetrahydropyranyloxystyrene, p-trimethylsiloxystyrene, and p-methoxymethoxystyrene to form a copolymer of the rational formula (5) shown below, and treating the copolymer with an acid to partially and selectively split of only tert-butoxy groups.

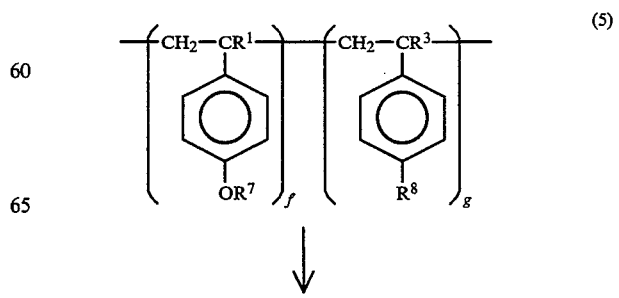

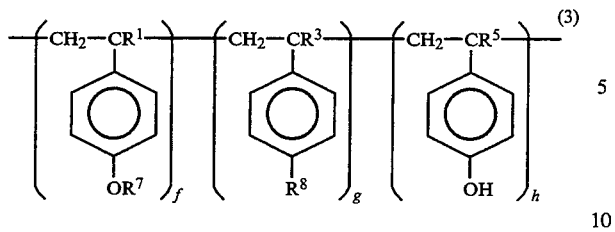

It is understood that f'+g=1 in formula (5) and f+g+h=1 in formula (3).

The polymerization to form a copolymer of formula (5) may be effected by any desired method including radical, cationic and anionic polymerization methods.

The resulting copolymer of formula (5) is optionally worked up and isolated by adding methanol to the reaction mixture to cause precipitation, followed by washing and drying. As previously mentioned, if a composition base on a polymer containing impurities is used as a resist in the manufacture of super LSI, the impurities can adversely affect the wafer manufacturing process. Therefore, full purification of the polymer is recommended. Additionally, since resist properties largely depend on the molecular weight dispersity of the polymer, it is preferred to control the molecular weight distribution by any desired method, for example, by removing a low molecular weight moiety from the copolymer of formula (5) by fractionation, so that the dispersity may fall in the range of 1.0 to 1.4, preferably 1.0 to 1.3.

Next, only ether bonds of $R^7$ in the copolymer of formula (5) are partially and selectively split off with an acid, obtaining a copolymer represented by rational formula (3). Scission of typically tert-butoxy groups is readily carried out by dissolving the polymer in a solvent such as dioxane, acetone, acetonitrile and benzene or a mixture thereof, and adding dropwise an acid such as hydrochloric acid, hydrobromic acid, para-toluenesulfonate pyridinium salt and trifluoroacetic acid. The degree of splitting off varies with the amount of acid added. In the case of hydrochloric acid, for example, the degree of splitting off is controlled by suitably selecting the amount of hydrochloric acid in the range of 0.1 to 2 times the moles of ether bonds. It is recommended from the standpoints of film retention, resolution and pattern configuration that the value of f representative of the residual proportion of tert-butoxy groups (or other groups represented by $R^7$) is controlled to fall in the range of 0.04 to 0.3, more preferably 0.1 to 0.2. It is also preferred that q is in the range of 0.01 to 0.3, especially 0.01 to 0.1 and h is in the range of 0.4 to 0.95, especially 0.7 to 0.89.

Component (B) in the resist composition of the invention is an acid release agent capable of generating an acid upon exposure to light, which is typically an onium salt cationic photo-initiator. The acid release agent is to generate strong acid upon exposure to light. In a wafer stepper, the onium salt in the exposed resist film is decomposed to generate strong acid which in turn, causes cleavage of OR groups in the polymer of formula (1) to (3) into hydroxyl groups as shown below whereby the polymer becomes alkali soluble. It is understood that R is $R^2$, $R^4$, $R^6$ or $R^7$.

Typical of the acid release agent are onium salt cationic photo-initiators, examples of which are given below.

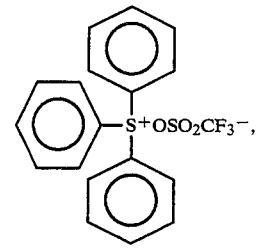

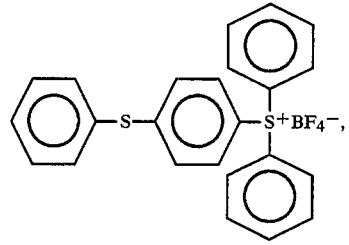

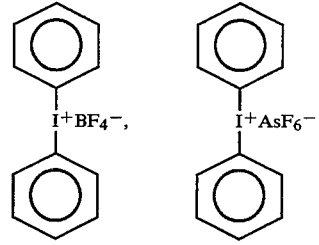

Other useful onium salt cationic photo-initiators are disclosed in JP-A 45439/1984, 440/1987, and 300250/1989, and U.S. Pat. No. 4,537,854. The onium salts are not limited to these examples and any substances capable of generating acid upon exposure to light may be used.

Preferably the acid release agents or onium salt cationic photo-initiators are blended in amounts of about 0.1 to about 15% by weight, more preferably about 0.5 to about 5% by weight of the resist composition. With less than 0.1% by weight of the acid release agent, the composition would have low sensitivity though it still retains positive resist performance. As the amount of acid release agent increases, the resist is increased in sensitivity. Above 15% by weight of the acid release agent, no further increase of sensitivity is expected though the composition still retains positive resist performance. Since the acid release agent is an expensive reagent and an increase of a low molecular weight component in the resist can lower the mechanical strength of a resist film, it is recommended to add the acid release agent in an amount of up to 15% by weight.

In the resist composition of the invention, component (C) or dissolution inhibitor having an acid unstable group such as tert-butoxy, tert-butoxycarbonyloxy, tert-butoxycarbonylmethyl and the like is blended with the above-mentioned components (A) and (B). Exemplary dissolution inhibitors are derivatives of bisphenol-A in which at least one OH group is replaced by a tert-butoxy or tert-butoxycarbonyloxy (t-Boc) group. Other exemplary dissolution inhibitors are shown below. It is preferred from the standpoint of resolution that at least one acid unstable group is a tert-butoxycarbonyloxy group.

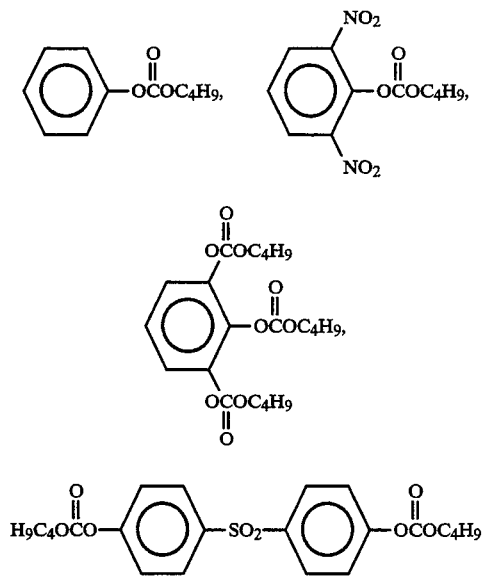

The dissolution inhibitor is preferably blended in an amount of 5 to 40% by weight of the entire resist composition. Less than 5% by weight of the dissolution inhibitor would provide less dissolution inhibition effect whereas more than 40% by weight of the dissolution inhibitor would adversely affect mechanical strength, heat resistance and resolution.

The resist composition of the present invention is generally prepared by dissolving components (A), (B) and (C) in a multiple amount of an organic solvent. The organic solvent used herein is desirably one in which the respective components are fully soluble and which allows for uniform spread of a resist film. Examples include butyl acetate, xylene, acetone, cellosolve acetate, ethylene glycol monomethyl ether, diethylene glycol monomethyl ether, ethylene glycol monoethyl ether, diethylene glycol dibutyl ether, diethylene glycol dimethyl ether (diglyme), ethyl lactate, methyl lactate, propyl lactate, and butyl lactate alone or in admixture of two or more.

The use and light exposure of the resist composition may be in accord with the well-known conventional lithography. In particular, the resist composition of the invention is adapted for fine patterning with deep-ultraviolet light having a wavelength of 254 to 193 nm.

There has been described a positive resist composition which is sensitive to high energy radiation and improved in sensitivity, resolution and plasma etching resistance, and yields a resist pattern having higher heat resistance. The resist pattern has little tendency of overhanging, implying improved dimensional control. By virtue of these advantages, especially reduced absorption at the exposure wavelength of a KrF excimer laser, a fine pattern having perpendicular walls to the substrate can be readily formed.

EXAMPLE

Examples of the present invention are given below by way of illustration and not by way of limitation. Mw is a weight average molecular weight and the dispersity is a molecular weight distribution Mw/Mn.

Synthesis 1

A 500-ml flask was charged with 2.4 grams of 2,2'-azobisisobutylnitrile, 60 grams of p-tert-butoxystyrene, and 120 ml of benzene and purged with nitrogen. The mixture was subject to polymerization at 90° C. for 7 hours. The resulting polymer was washed with methanol and dried. On analysis by gas permeation chromatography (GPC), the polymer had a Mw of 17,000 and a dispersity of 2.01. The yield was 70%.

The polymer was further dissolved in a benzene/methanol solvent mixture for fractionation. The polymer was dried again, obtaining 29 grams of poly-p-butoxystyrene having a Mw of 15,000 and a dispersity of 1.35. This is designated Polymer A.

By a similar procedure, p-tert-butoxy-α-methylstyrene was radically polymerized and fractionated, obtaining a p-tert-butoxy-α-methylstyrene polymer having a Mw of 16,000 and a dispersity of 1.30. This is designated Polymer B.

A 500-ml flask was charged with 50 grams of Polymer A or B and 200 ml of acetone. The flask was then heated to 60° C. An acid, 15% aqueous hydrochloric acid or trifluoroacetic acid, the amount of which is shown in Table 1, was added dropwise to the flask over about one hour and partial scission reaction was continued for 6 hours. The flask was cooled down. The resulting polymer was washed with water, dried, and analyzed for a degree of splitting by Fourier transform infrared spectroscopy (FT IR). The degree of splitting was determined from the absorbance ratio of the absorption peak at 1512 cm$^{-1}$ attributable to phenyl group to the absorption peak at 897 cm$^{-1}$ attributable to t-butyl group.

TABLE 1

| No. | Polymer | Acid Type | Amount* | Degree of splitting (mol %) | Resin |
|---|---|---|---|---|---|
| 1 | A | 15% HCl | 0.5 mol | 95 | |
| 2 | A | 15% HCl | 0.2 mol | 80 | C |
| 3 | A | 15% HCl | 0.1 mol | 54 | |
| 4 | A | CF$_3$COOH | 1.0 mol | 92 | |
| 5 | A | CF$_3$COOH | 0.5 mol | 78 | D |
| 6 | A | CF$_3$COOH | 0.25 mol | 52 | |
| 7 | B | 15% HCl | 0.4 mol | 82 | |
| 8 | B | 15% HCl | 0.2 mol | 76 | E |
| 9 | B | 15% HCl | 0.15 mol | 64 | |

*The amount (mol) of acid is per mol of OR$^2$ (butoxy) group in the polymer.

Example 1

A resist solution was prepared by dissolving 9.6 grams of Resin C (poly-tert-butoxystyrene/polyhydroxystyrene) obtained in Synthesis 1, 0.48 grams of a compound of the formula (6) shown below as an acid release agent, and 1.92 grams of 2,2-bis[p-(t-butoxycarbonyloxy)phenyl]propane as a dissolution inhibitor in 66 grams of diethylene glycol dimethyl ether and passing the mixture through a 0.2-μm mesh filter.

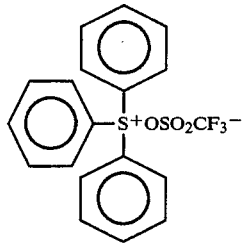
(6)

The resist solution was spin coated on a silicon substrate at 2,000 rpm and pre-baked on a hot plate at 100° C. for 2 minutes. The resist film was 0.8 μm thick. The resist film was exposed to a pattern using an electron beam at an accelerating voltage of 30 kV, post-exposure baked (PEB) at 85° C. for 90 seconds, developed for one minute with an aqueous solution of 2.4% tetramethylammonium hydroxide (TMAH), and rinsed with water for 30 seconds. The resist had a $D_0$ sensitivity of 7 μC/cm² and bore a positive pattern.

When deep-ultraviolet light or KrF excimer laser light (wavelength 248 nm) was used instead of the electron beam, the $D_0$ sensitivity was 24 mJ/cm².

A line and space pattern of 0.28 μm could be resolved in the KrF excimer laser exposure whereas a line and space pattern of 0.22 μm could be resolved in the electron beam exposure.

Example 2

A resist film was prepared by the same procedure as in Example 1 except that Resin C was replaced by Resin D (poly-tert-butoxystyrene/polyhydroxystyrene). The electron beam sensitivity was 8.4 μC/cm² and the KrF sensitivity was 28 mJ/cm², indicating equivalent resolution to Example 1. It was also found that the pattern resulting from KrF laser exposure had perpendicular side walls.

Example 3

A resist film was prepared by the same procedure as in Example 1 except that Resin C was replaced by Resin E (poly-tert-butoxy-α-methylstyrene/polyhydroxystyrene) and an onium salt of the formula (7) shown below was used as the acid release agent.

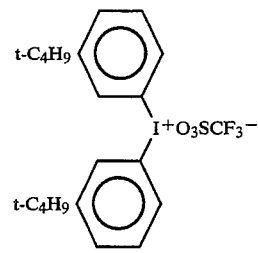
(7)

It was found that PEB at 90° C. for 90 seconds resulted in a resist having a positive pattern. The electron beam sensitivity was 6.5 μC/cm². Under the developing conditions in Example 1, this resist had good film retention as demonstrated by a film loss of about 2% and a line and space pattern of 0.22 μm could be resolved. Evaluation was also made with exposure to KrF excimer laser light to find full resolution of a line and space pattern of 0.28 μm. Comparative Example 1

A solution of 20 grams of p-tert-butoxystyrene monomer and 0.40 grams of 2,2-azobisisobutylnitrile in 20 ml of toluene was subject to reaction at 70° C. for 5 hours in a nitrogen atmosphere. The resulting polymer was washed with methanol and dried, obtaining 14 grams of poly-tert-butoxystyrene. On GPC analysis, the polymer had a Mw of 9,000 and a dispersity of 1.90. The polymer was then subject to partial scission reaction for 6 hours with 15% aqueous hydrochloric acid in an amount of 3.0 mol per mol of butoxy group in the polymer. The degree of splitting was 100%. The polymer was washed and dried. It was then dissolved in 100 ml of pyridine. By adding di-tert-butyl dicarbonate to the solution, the polymer was tert-butoxycarbonylated. The t-Boc content was 20 mol% as measured by NMR.

A resist solution was prepared using this polymer along with the acid release agent, dissolution inhibitor and solvent used in Example 1. As in Example 1, exposure was made to KrF excimer laser light by means of a stepper. As a result, a pattern could be resolved up to 0.4 μm, but no finer pattern could be resolved.

Synthesis 2

A 500-ml flask was charged with 2.4 grams of 2,2'-azobisisobutylnitrile, 47.8 grams of p-tert-butoxystyrene, 11.2 grams of p-methoxymethoxystyrene, and 120 ml of benzene and purged with nitrogen. The mixture was subject to polymerization at 90° C. for 6 hours. The resulting polymer was washed with methanol and dried. On GPC analysis, the polymer had a Mw of 16,500 and a dispersity of 1.87. The yield was 72%.

The polymer was further dissolved in a benzene/methanol solvent mixture for fractionation. The polymer was dried again, obtaining Polymer F of the rational formula shown below having a Mw of 14,500 and a dispersity of 1.30. On proton-NMR analysis of the polymer, there appeared peaks at 1.5 ppm attributable to tert-butyl group, at 4.8 ppm attributable to —O—CH$_2$—O, and at 3.1 ppm attributable to —O—CH$_3$. In formula (F), c':d=0.8:0.2.

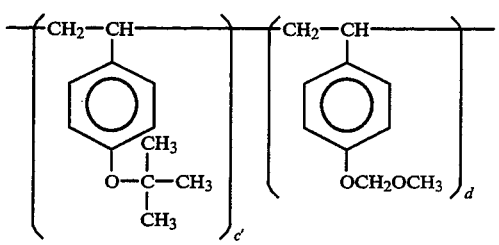
(F)

Synthesis 3

As in Synthesis 2, p-tert-butoxy-α-methylstyrene and p-methoxymethoxystyrene were radically polymerized and fractionated, obtaining Polymer G of the rational formula shown below. It had a Mw of 17,500 and a dispersity of 1.25. In formula (G), c':d =0.9:0.1.

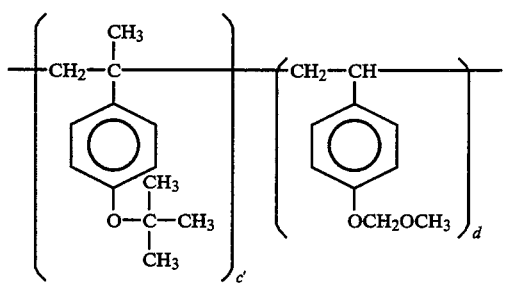
(G)

Synthesis 4

To remove water and other impurities from p-tert-butoxystyrene and p-methoxymethoxy-α-methylstyrene monomers, these monomers were distilled in the presence of a purifying aid such as CaH$_2$ and sodium benzophenone. A 1-liter flask was charged with 550 ml of tetrahydrofuran (THF) as a solvent and $3.3 \times 10^{-4}$ mol of n-butyllithium as a polymerization initiator and cooled to −78° C. To the flask was added a mixture of the purified monomers. Upon polymerization for one hour, the reaction solution turned red. Methanol was added to the reaction solution to stop polymerization. The reaction solution was poured into methanol whereby the polymer was precipitated. The polymer was separated and dried, obtaining 48 grams of a white polymer H of the rational formula shown below. On GPC analysis, it was found to be a narrow disperse polymer having a Mw of 15,000 and a dispersity of 1.03. On proton-NMR analysis, there appeared peaks at 1.5 ppm attributable to tert-butyl group, at 4.8 ppm attributable to —O—CH$_2$—O—, and at 3.1 ppm attributable to —O—CH$_3$. In formula (H), c':d=0.7:0.3.

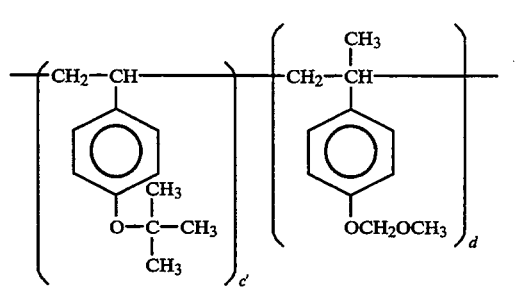
(H)

Synthesis 5

As in Synthesis 4, an equimolar mixture of p-tert-butoxystyrene and tetrahydropyranyloxystyrene was subject to living polymerization in THF solvent at −70° C. The reaction solution was washed with methanol, precipitated, and dried, obtaining 50 grams of a white polymer I of the rational formula shown below. On GPC analysis, it was found to be a narrow disperse polymer having a Mw of 13,500 and a dispersity of 1.05. In formula (I), c':d=0.8:0.2.

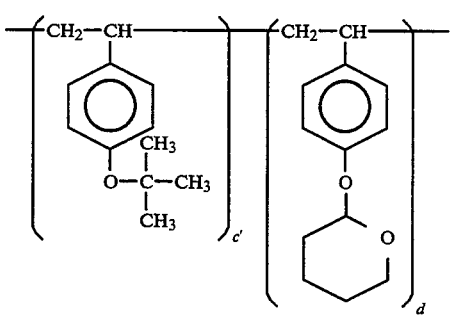
(I)

Synthesis 6

As in Synthesis 2, an equimolar mixture of p tert-butoxystyrene and trimethylsiloxystyrene was radically polymerized, obtaining Polymer J of the rational formula shown below. It had a Mw of 14,200 and a dispersity of 1.06. In formula (J), c':d=0.8:9.2.

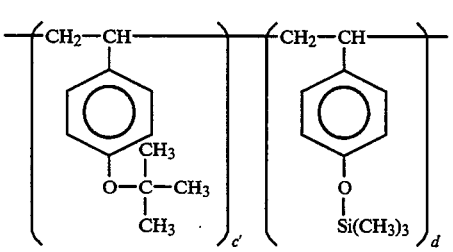
(J)

A 500-ml flask was charged with 40 grams of each of Polymers F to J in Synthesis Examples 2 to 6. The polymer was dissolved in 200 ml of acetone. By adding an acid, the type and amount of which are shown in Table 2, to the flask, partial scission reaction was carried out. The flask was cooled down. The resulting polymer was washed with water, dried, and analyzed by proton-NMR to determine the residual amounts of a tert-butyl group and a $R^6$ group (methoxymethyl, tetrahydropyranyl or trimethylsilyl group). The results are shown in Table 2.

TABLE 2

| | | | | Final polymer | | |
| | Starting | Acid | | | $R^6$ | |
| No. | polymer | Type | Amount* | t-butyl | (mol) | Resin |
|---|---|---|---|---|---|---|
| 11 | F | dry HCl | 0.4 mol | 0.05 | 0.2 | K |
| 12 | F | dry HCl | 0.2 mol | 0.20 | 0.2 | |
| 13 | G | dry HCl | 0.2 mol | 0.25 | 0.1 | |
| 14 | G | CF$_3$COOH | 0.4 mol | 0.07 | 0.1 | L |
| 15 | G | CF$_3$COOH | 0.25 mol | 0.15 | 0.1 | |
| 16 | H | dry HCl | 0.3 mol | 0.10 | 0.3 | M |
| 17 | H | dry HCl | 0.15 mol | 0.25 | 0.3 | |
| 18 | I | dry HCl | 0.40 mol | 0.05 | 0.2 | N |
| 19 | I | dry HCl | 0.30 mol | 0.10 | 0.2 | |
| 20 | J | dry HCl | 0.40 mol | 0.05 | 0.2 | O |

TABLE 2-continued

| | Starting | Acid | | Final polymer R⁶ | | |
|---|---|---|---|---|---|---|
| No. | polymer | Type | Amount* | t-butyl | (mol) | Resin |
| 21 | J | dry HCl | 0.30 mol | 0.08 | 0.2 | |

*The amount (mol) of acid is per mol of OR⁴ (butoxy) group in the polymer.

The resulting resins K to O are represented by the following rational formulae.

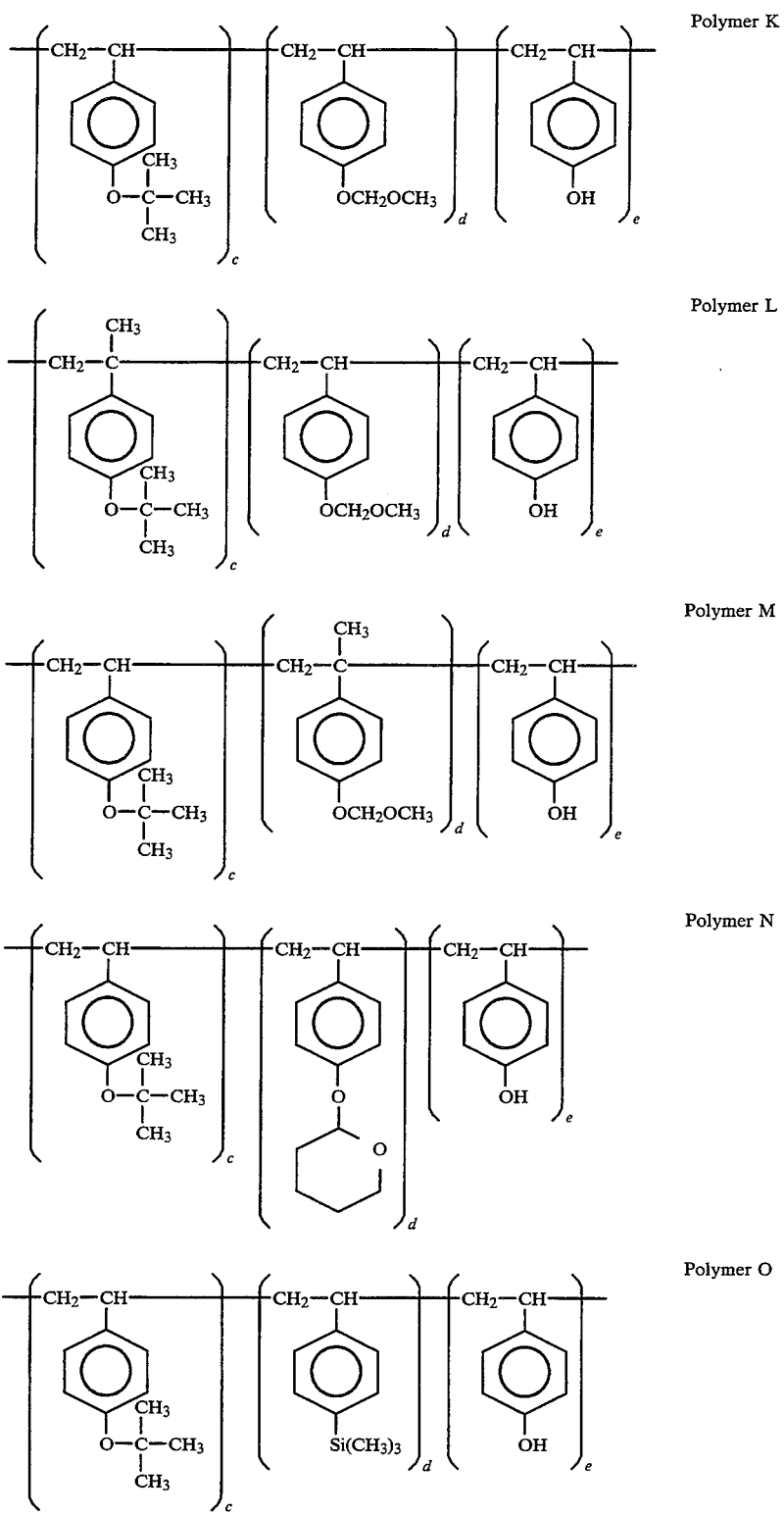

It is understand that by reacting p-tert-butoxystyrene or p-tert-butoxy-α-methylstyrene with p-isopropoxymethoxystyrene, p-tetrahydrofuranyloxystyrene or p-tert-butoxy-carbonyloxystyrene in a similar manner, there are obtained polymers of rational formula (2)

wherein R⁶ is an isopropoxymethyl, tetrahydrofuranyl or tert-butoxycarbonyl group.

Example 4

A resist solution was prepared by dissolving 9.6 grams of Resin K (poly-p-tert-butoxystyrene/poly-p-methoxymethoxy-styrene/polyhydroxystyrene copolymer) obtained in Synthesis 2, 0.48 grams of a compound of formula (6) shown below as an acid release agent, and 1.92 grams of 2,2-bis[p-(t-butoxycarbonyloxy)phenyl]-propane as a dissolution inhibitor in 66 grams of diglyme and passing the mixture through a 0.2 μm mesh filter.

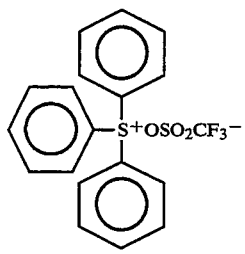
(6)

The resist solution was spin coated on a silicon substrate at 2,000 rpm and pre-baked on a hot plate at 100° C. for 2 minutes. The resist film was 0.9 μm thick. The resist film was exposed to a pattern using an electron beam at an accelerating voltage of 30 kV, post-exposure baked (PEB) at 85° C. for 90 seconds, developed for one minute with an aqueous solution of 2.4% tetramethylammonium hydroxide (TMAH), and rinsed with water for 30 seconds. The resist had a $D_0$ sensitivity (or electron sensitivity) of 5 μC/cm² and bore a positive pattern.

When deep-ultraviolet light or KrF excimer laser light (wavelength 248 nm) was used instead of the electron beam, the $D_0$ sensitivity was 15 mJ/cm².

A line and space pattern of 0.26 μm could be resolved in the KrF excimer laser exposure whereas a line and space pattern of 0.25 μm could be resolved in the electron beam exposure.

Example 5

A resist film was prepared by the same procedure as in Example 4 except that Resin L was used. The electron beam sensitivity was 7.4 μC/cm² and the KrF sensitivity was 26 mJ/cm², indicating equivalent resolution to Example 4. It was also found that the pattern resulting from KrF laser exposure had perpendicular side walls.

Example 6

A resist film was prepared by the same procedure as in Example 4 except that Polymer M and an onium salt of formula (7) shown below as the acid release agent were used.

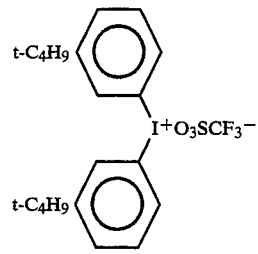
(7)

It was found the PEB at 90° C. for 90 seconds resulted in a resist having a positive pattern. The electron beam sensitivity was 6.5 μC/cm². Under the developing conditions in Example 4, this resist had good film retention as demonstrated by a film loss of about 2% and line and space pattern of 0.22 μm could be resolved. Evaluation was also made with exposure to KrF excimer laser light to find full resolution of a line and space pattern of 0.27 μm.

Example 7

A resist solution was prepared by the same procedure as in Example 6 except that Polymer N was used, and coated on a wafer. The resist film was exposed in a dose of 40 mJ/cm² by means of an excimer stepper, baked (PEB) at 90° C. for 90 seconds, and developed with 2.38% TMAH. A line and space pattern of 0.26 μm having perpendicular side walls could be resolved.

Example 8

A resist film was similarly prepared except that Polymer O and t-butylidodonium trifulate as an acid release agent were used, and similarly evaluated. A fine pattern was formed as in Example 7.

Example 9

Equivalent resolution was achieved when polymers of formula (2) wherein R⁶ is an isopropoxymethyl, tetrahydrofuranyl or tert-butoxycarbonyl group are used.

Comparative Example 2

A solution of 20 grams of p-tert-butoxystyrene monomer and 0.40 grams of 2,2-azobisisobutylnitrile in 20 ml of toluene was subject to reaction at 70° C. for 5 hours in a nitrogen atmosphere. The resulting polymer was washed with methanol and dried, obtaining 14 grams of poly-tert-butoxystyrene. On GPC analysis, the polymer had a Mw of 9,000 and a dispersity of 1.90. The polymer was then subject to partial scission reaction for 6 hours with 15% aqueous hydrochloric acid in an amount of 3.0 mol per mol of butoxy group in the polymer. The degree of splitting was 100%. The polymer was washed and dried. It was then dissolved in 100 ml of pyridine. By adding di-tert-butyl dicarbonate to the solution, the polymer was tert-butoxycarbonylated. The t-Boc content was 20 mol% as measured by NMR.

A resist solution was prepared using this polymer along with the acid release agent, dissolution inhibitor and solvent used in Example 4. As in Example 4, exposure was made to KrF excimer laser light by means of a stepper. As a result, a pattern could be resolved up to 0.4 μm, but no finer pattern could be resolved.

Synthesis 7

A 500-ml flask was charged with 2.4 Grams of 2,2'-azobisisobutylnitrile, 63.3 grams (0.36 mol) of p-tert-butoxystyrene, 6.6 grams (0.04 mol) of p-methoxystyrene, and 120 ml of benzene and purged with nitrogen. The mixture was subject to polymerization at 90° C. for 6 hours. The resulting polymer was washed with methanol and dried. On GPC analysis, the polymer had a Mw of 16,500 and a dispersity of 1.67. The yield was 72%.

The polymer was further dissolved in a benzene/methanol solvent mixture for fractionation. The polymer was dried again, obtaining Polymer P of the rational formula shown below having a Mw of 14,500 and a dispersity of 1.30. On proton-NMR analysis of the polymer, there appeared peaks at 1.5 ppm attributable to tert-butyl group and at 3.1 ppm attributable to —O—CH$_3$. In formula (P), f':g=0.9:0.1.

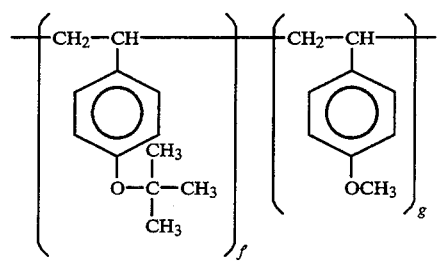

Synthesis 8

As in Synthesis 7, p-tetrahydro-pyranyloxystyrene and p-methoxystyrene were radically polymerized and fractionated, obtaining Polymer Q of the rational formula shown below. It had a Mw of 16,500 and a dispersity of 1.25. In formula (Q), f':g=0.95:0.05.

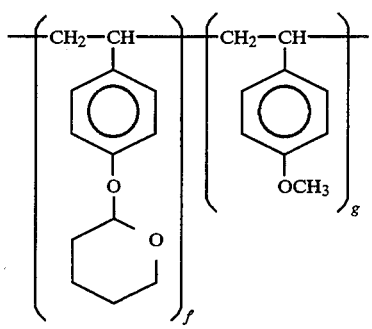

Synthesis 9

To remove water and other impurities from p-methoxymethoxy-α-methylstyrene and p-methoxystyrene monomers, these monomers were distilled in the presence of a purifying aid such as CaH$_2$ and sodium benzophenone. A 1-liter flask was charged with 550 ml of tetrahydrofuran (THF) as a solvent and 3.3×10$^{-4}$ mol of n-butyllithium as a polymerization initiator and cooled to −78°0 C. To the flask was added a mixture of the purified monomers. Upon polymerization for one hour, the reaction solution turned red. Methanol was added to the reaction solution to stop polymerization. The reaction solution was poured into methanol whereby the polymer was precipitated. The polymer was separated and dried, obtaining 48 grams of a white polymer R of the rational formula shown below. On GPC analysis, it was found to be a narrow disperse polymer having a Mw of 15,000 and a dispersity of 1.03. On proton-NMR analysis, there appeared peaks at 4.8 ppm attributable to —O—CH$_2$—O— and at 3.1 ppm attributable to —O—CH$_3$. In formula (R), f':g=0.95:0.05.

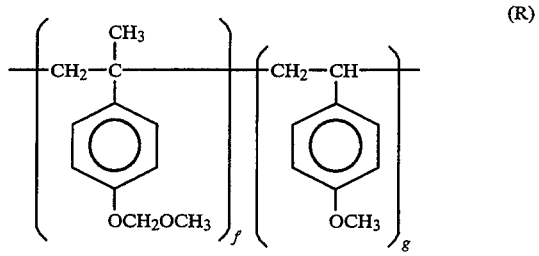

Synthesis 10

As in Synthesis 7, an equimolar mixture of p-trimethylsiloxystyrene and p-methoxystyrene was radically polymerized in benzene solvent. The reaction solution as washed with methanol, precipitated, and dried, obtaining 50 grams of a white polymer S of the rational formula shown below. On GPC analysis, the polymer was found to have a Mw of 13,500 (calculated as polystyrene) and a dispersity of 1.25. In formula (S), f':g=0.9:0.1.

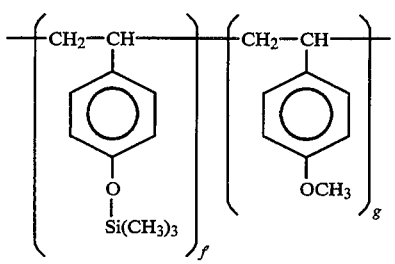

A 500-ml flask was charged with 40 grams of each of Polymers P to S in Synthesis Examples 7 to 10. The polymer was dissolved in 200 ml of acetone. By adding an acid, the type and amount of which are shown in Table 3, to the flask, partial scission reaction was carried out. The flask was cooled down. The resulting polymer was washed with water, dried, and analyzed by proton-NMR to determine the residual amounts of a R$^8$ group (methoxy group) and a R$^7$ group (tert-butyl, methoxymethyl, tetrahydropyranyl or trimethylsilyl group). The results are shown in Table 3.

TABLE 3

| No. | Starting polymer | Acid Type | Acid Amount* | Final polymer methoxy (mol %) | Final polymer R$^7$ (mol) | Resin |
|---|---|---|---|---|---|---|
| 31 | P | dry HCl | 0.4 mol | 0.10 | 0.15 | T |
| 32 | P | dry HCl | 0.2 mol | 0.10 | 0.20 | |
| 33 | Q | conc. HCl | 0.2 mol | 0.05 | 0.16 | |
| 34 | Q | CF$_3$COOH | 0.4 mol | 0.05 | 0.12 | U |
| 35 | Q | CF$_3$COOH | 0.25 mol | 0.05 | 0.10 | |
| 36 | R | conc. HCl | 0.3 mol | 0.05 | 0.15 | V |
| 37 | R | conc. HCl | 0.15 mol | 0.05 | 0.24 | |
| 38 | S | conc. HCl | 0.40 mol | 0.10 | 0.10 | W |

TABLE 3-continued

| Starting polymer No. | Acid Type | Acid Amount* | Final polymer methoxy (mol %) | R⁷ (mol) | Resin |
|---|---|---|---|---|---|
| 39 | S | conc. HCl | 0.30 mol | 0.10 | 0.20 |

*The amount (mol) of acid is per mol of OR⁷ group in the polymer.

The resulting resins T to W are represented by the following rational formulae.

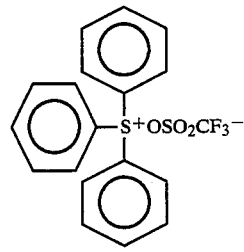

(6)

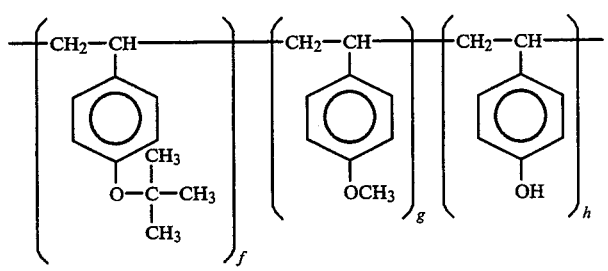

Polymer T

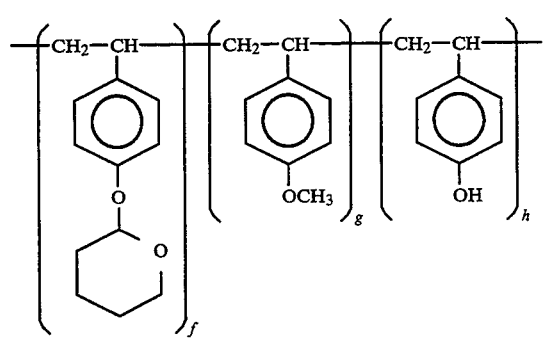

Polymer U

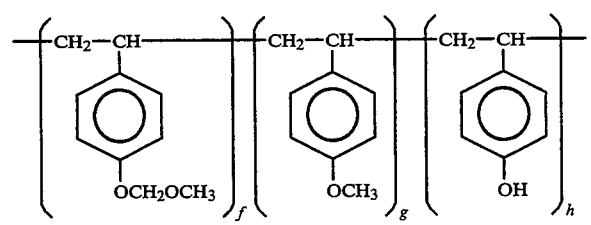

Polymer V

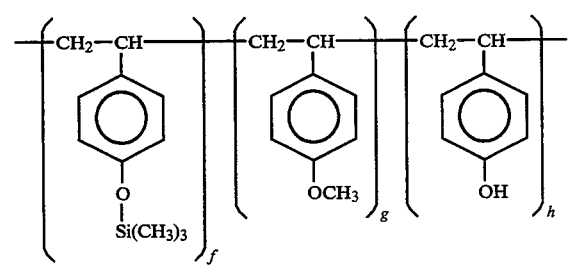

Polymer W

Example 10

A resist solution was prepared by dissolving 9.6 grams of Resin T (poly-tert-butoxystyrene/poly-p-methoxystyrene/polyhydroxystyrene copolymer) obtained in Synthesis 7, 0.48 grams of a compound of formula (6) shown below as an acid release agent, and 1.92 grams of 2,2-bis[p-(t-butoxy-carbonyloxy)phenyl]-propane as a dissolution inhibitor in 66 grams of diglyme and passing the mixture through a 0.2 μm mesh filter.

The resist solution was spin coated on a silicon substrate at 2,000 rpm and pre-baked on a hot plate at 100° C. for 2 minutes. The resist film was 0.95 μm thick. The resist film was exposed to a pattern using an electron beam at an accelerating voltage of 30 kV, post-exposure baked (PEB) at 85° C. for 90 seconds, developed for one minute with an aqueous solution of 2.4% tetramethylammonium hydroxide (TMAH), and rinsed with water for 30 seconds. The resist had a $D_0$ sensitivity of 5 μC/cm² and bore a positive pattern.

When deep-ultraviolet light or KrF excimer laser light (wavelength 248 nm) was used instead of the electron beam, the $D_0$ sensitivity was 10 mJ/cm$^2$.

A line and space pattern of 0.26 μm was resolved in the KrF excimer laser exposure whereas a line and space pattern of 0.25 μm was resolved in the electron beam exposure.

Example 11

A resist film was prepared by the same procedure as in Example 10 except that Resin U was used. The electron beam sensitivity was 6.3 μC/cm$^2$ and the KrF sensitivity was 20 mJ/cm$^2$, indicating equivalent resolution to Example 10. It was also found that the pattern resulting from KrF laser exposure had perpendicular side walls.

Example 12

A resist film was prepared by the same procedure as in Example 10 except that Polymer V and an onium salt of formula (7) shown below as the acid release agent were used.

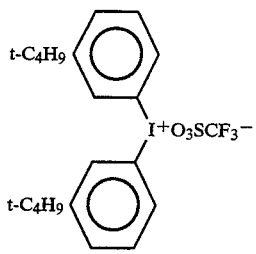

(7)

It was found that PEB at 90° C. for 90 seconds resulted in a resist having a positive pattern. The electron beam sensitivity was 6.5 μC/cm$^2$. Under the developing conditions in Example 10, this resist had good film retention as demonstrated by a film loss of about 2% and a line and space pattern of 0.22 μm was resolved. Evaluation was also made with exposure to KrF excimer laser light to find full resolution of a line and space pattern of 0.27 μm.

Example 13

A resist solution was prepared by the same procedure as in Example 12 except that Polymer W was used, and coated on a wafer. The resist film was exposed in a dose of 40 mJ/cm$^2$ by means of an excimer stepper, baked (PEB) at 90° C. for 90 seconds, and developed with 2.38% TMAH. A line and space pattern of 0.26 μm having perpendicular side walls could be resolved.

Example 14

A resist film was similarly prepared except that Polymer V and t-butylidodonium trifulate as an acid release agent were used, and similarly evaluated. A fine pattern was formed as in Example 13.

Comparative Example 3

A solution of 20 grams of p-tert-butoxystyrene monomer and 0.40 grams of 2,2-azobisisobutylnitrile in 20 ml of toluene was subject to reaction at 70° C. for 5 hours in a nitrogen atmosphere. The resulting polymer was washed with methanol and dried, obtaining 14 grams of poly-tert-butoxystyrene. On GPC analysis, the polymer had a Mw of 9,000 and a dispersity of 1.90. The polymer was then subject to partial scission reaction for 6 hours with 15% aqueous hydrochloric acid in an amount of 3.0 mol per mol of butoxy group in the polymer. The degree of splitting was 100%. The polymer was washed and dried. It was then dissolved in 100 ml of pyridine. By adding di-tert-butyl dicarbonate to the solution, the polymer was tert-butoxycarbonylated. The t-Boc content was 20 mol% as measured by NMR.

A resist solution was prepared using this polymer along with the acid release agent, dissolution inhibitor and solvent used in Example 4. As in Example 4, exposure was made to KrF excimer laser light by means of a stepper. As a result, a pattern could be resolved up to 0.4 μm, but no finer pattern could be resolved.

Although some preferred embodiments have been described, many modifications and variations may be made thereto in the light of the above teachings. It is therefore to be understood that within the scope of the appended claims, the invention may be practiced otherwise than as specifically described.

We claim:

1. A resist composition comprising a base resin, an acid release agent capable of generating an acid upon exposure to light, and a dissolution inhibitor containing an acid unstable group, said base resin being represented by the following rational formula (1), (2) or (3):

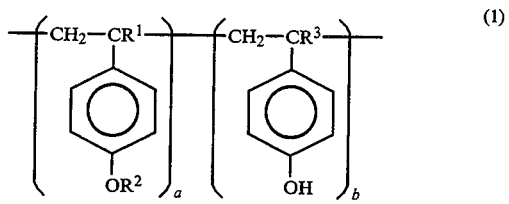

(1)

wherein each of R$^1$ and R$^3$ is a hydrogen atom or methyl group, R$^2$ is a tert-butyl group, and letters a and b satisfy a+b=1,

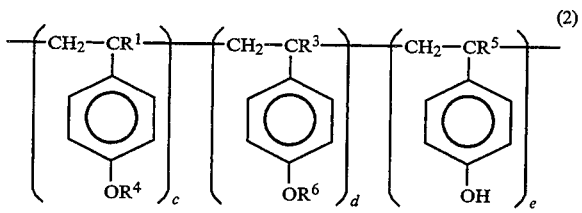

(2)

wherein each of R$^1$, R$^3$ and R$^5$ is a hydrogen atom or methyl group, R$^4$ is a tert-butyl group, R$^6$ is an acid hydrolyzable group selected from the group consisting of methoxymethyl, tetrahydro-pyranyl, trialkylsilyl, isopropoxymethyl, tetrahydrofuranyl, and tert-butoxycarbonyl groups, and letters c, d and e satisfy c+d+e=1,

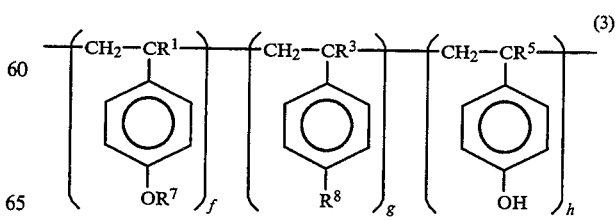

(3)

wherein each of R$^1$, R$^3$ and R$^5$ is a hydrogen atom or methyl group, R$^7$ is selected from the group consisting of tert-butyl, methoxymethyl, tetrahydropyranyl, and trialkylsilyl groups, and $R^8$ is a lower alkoxy group or a hydrogen atom, and letters f, g and h satisfy $f+g+h=1$.

2. A resist composition according to claim 1 wherein said base resin has a molecular weight dispersity Mw/Mn of 1.0 to 1.4.

3. A resist composition as in claim 1, wherein the base resin is of the rational formula (1)

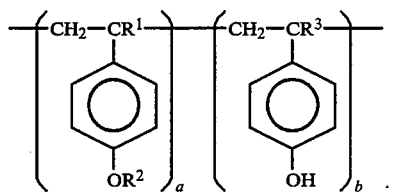

(1)

4. A resist composition according to claim 3, wherein said base resin has a molecular weight dispersity Mw/Mn of 1.0 to 1.4.

5. A resist composition as in claim 1, wherein the base resin is of the rational formula (2)

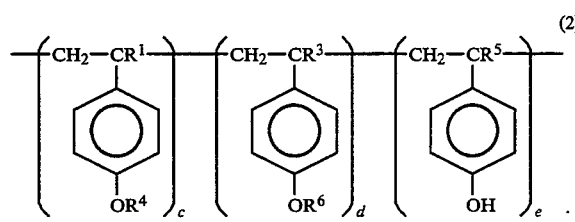

(2)

6. A resist composition according to claim 5, wherein said base resin has a molecular weight dispersity Mw/Mn of 1.0 to 1.4.

7. A resist composition as in claim 1, wherein the base resin is of the rational formula (3)

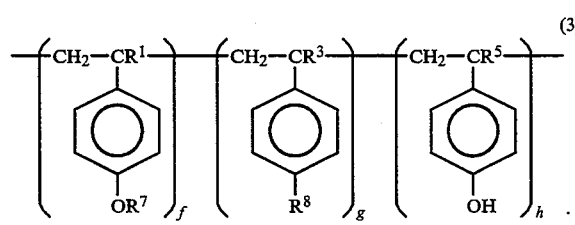

(3)

8. A resist composition according to claim 7, wherein said base resin has a molecular weight dispersity Mw/Mn of 1.0 to 1.4.

9. A resist composition as in claim 1, wherein the base resin is of the rational formula

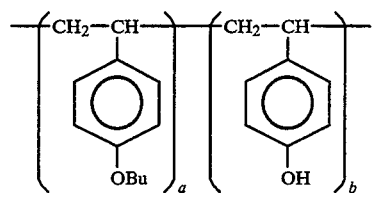

wherein $a+b=1$

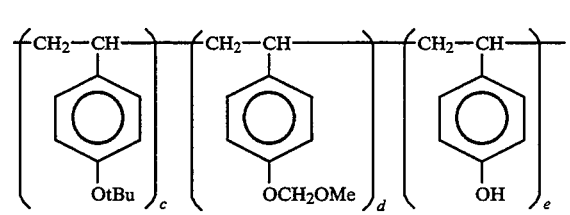

wherein $c+d+e=1$ or

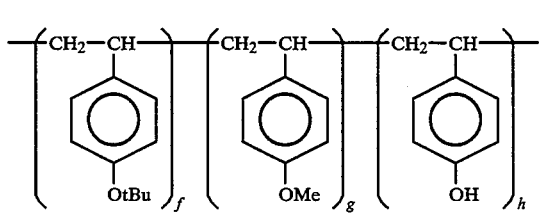

wherein $f+g+h=1$.

10. A resist composition as in claim 9, wherein the acid release agent is

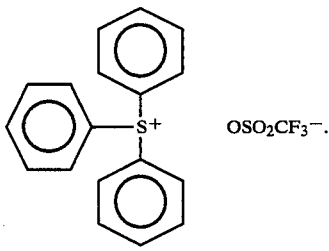

$OSO_2CF_3^-$.

11. A resist composition as in claim 9, wherein the dissolution inhibitor is 2,2,bis[p-(t-butoxycarboxyloxy)-phenylpropane.

12. A resist composition as in claim 1, wherein the base resin is a poly-tert-butoxy-α-methylstyrene, polyhydroxystyrene or of the rational formulae

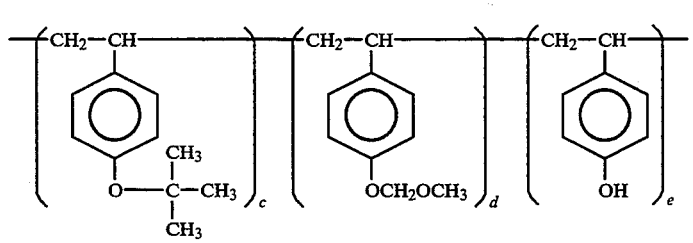

K

-continued
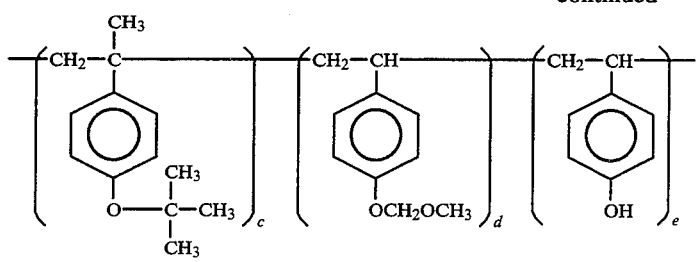
L
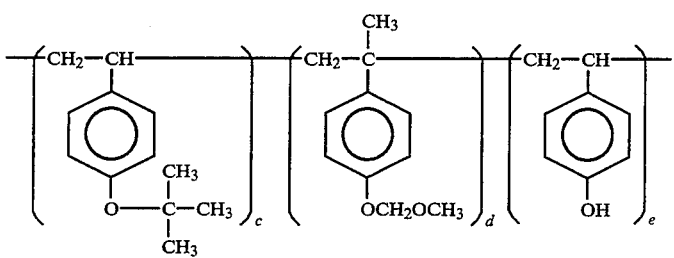
M
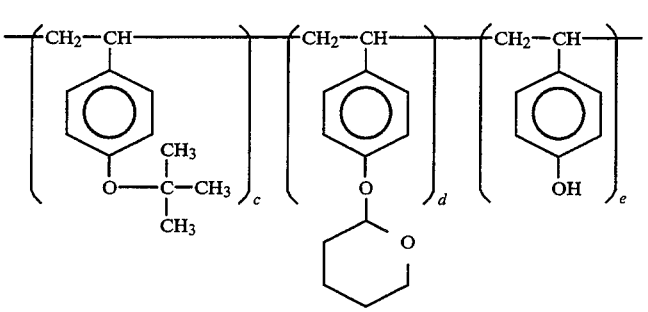
N
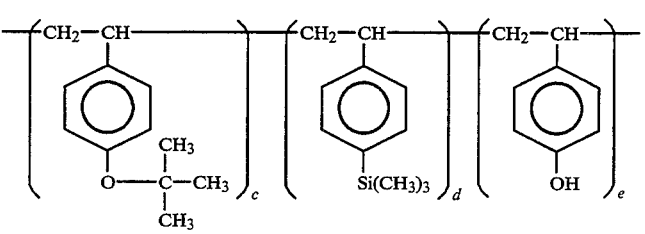
O
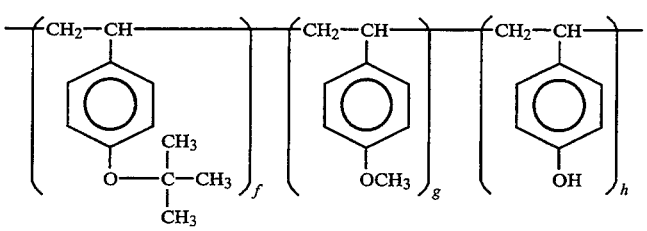
T
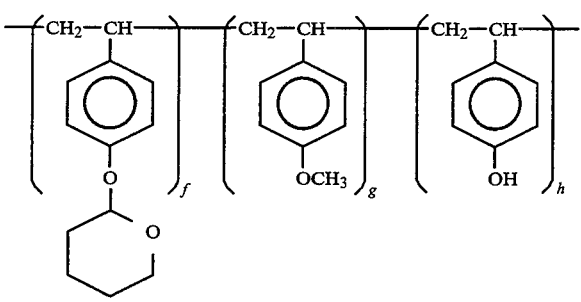
U

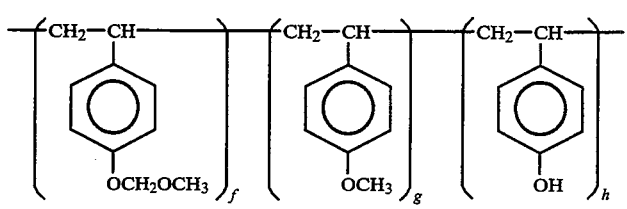
or
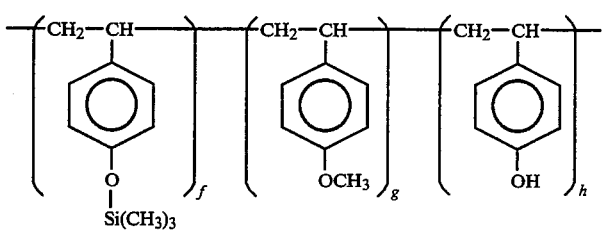
wherein a+b=1; a+d+e=1, and f+g+h=1.
* * * * *